(12) United States Patent
Yamamoto et al.

(10) Patent No.: US 9,412,676 B2
(45) Date of Patent: Aug. 9, 2016

(54) CERAMIC PACKAGE

(71) Applicant: NGK Spark Plug Co., Ltd., Nagoya-shi, Aichi-ken (JP)

(72) Inventors: Hiroaki Yamamoto, Kitanagoya (JP); Yoshitaka Yoshida, Kounan (JP); Takatoshi Tojo, Nishikasugai-gun (JP); Naoki Kito, Nagoya (JP); Kazushige Akita, Nagoya (JP); Jun Suzuki, Nagoya (JP)

(73) Assignee: NGK SPARK PLUG CO., LTD., Nagoya (JP)

( * ) Notice: Subject to any disclaimer, the term of this patent is extended or adjusted under 35 U.S.C. 154(b) by 0 days.

(21) Appl. No.: 14/360,143

(22) PCT Filed: Dec. 20, 2012

(86) PCT No.: PCT/JP2012/008151
§ 371 (c)(1),
(2) Date: May 22, 2014

(87) PCT Pub. No.: WO2013/099167
PCT Pub. Date: Jul. 4, 2013

(65) Prior Publication Data
US 2014/0319982 A1    Oct. 30, 2014

(30) Foreign Application Priority Data

Dec. 28, 2011 (JP) ................................. 2011-287655

(51) Int. Cl.
*H05K 1/03* (2006.01)
*H05K 1/18* (2006.01)
(Continued)

(52) U.S. Cl.
CPC ................ *H01L 23/10* (2013.01); *H01L 21/50* (2013.01); *H03H 9/1014* (2013.01);
(Continued)

(58) Field of Classification Search
CPC ....... H01L 23/10; H01L 21/50; H01L 9/1014; H01L 2224/16225; H01L 2224/32225; H01L 2224/73204; H01L 2924/00; H03H 9/1014; H05K 1/0306; H05K 1/18; H05K 1/183; H05K 2201/09036; H05K 2201/10075
USPC .................. 174/250–268; 361/760, 792–795; 257/678, 703–704
See application file for complete search history.

(56) References Cited

U.S. PATENT DOCUMENTS 6,229,404 B1 *  5/2001  Hatanaka ................. H03B 5/04
                                                257/698
6,777,858 B2 *  8/2004  Bang et al. .................... 310/348
(Continued)

FOREIGN PATENT DOCUMENTS

JP    H08-213499 A    8/1996
JP    H09-139439 A    5/1997
(Continued)

OTHER PUBLICATIONS

Taiwan Intellectual Patent Office, Notification for the Opinion of Examination, issued in corresponding Taiwanese Patent Application No. 101149965, mailed Aug. 24, 2015.
(Continued)

*Primary Examiner* — Ishwarbhai B Patel
(74) *Attorney, Agent, or Firm* — Stites & Harbison, PLLC; Jeffrey A. Harberlin; James R. Hayne

(57) ABSTRACT

A ceramic package includes a package main body which is formed of a ceramic material, which has a front surface and a back surface having a rectangular shape in plan view, and which has a cavity opening toward the front surface; a first metalized layer which has a frame shape in plan view and is formed on the front surface; and a second metalized layer which is formed on the front surface of the first metalized layer so as to assume a frame shape, and which has a width smaller than the width of the first metalized layer, wherein the width of the second metalized layer at each corner portion of the front surface in plan view is smaller than the width of the second metalized layer in a region other than the corner portion in plan view.

6 Claims, 4 Drawing Sheets

(51) Int. Cl.
*H01L 23/10* (2006.01)
*H01L 21/50* (2006.01)
*H03H 9/10* (2006.01)

(52) U.S. Cl.
CPC ............ *H05K 1/0306* (2013.01); *H05K 1/183* (2013.01); *H01L 2224/16225* (2013.01); *H01L 2224/32225* (2013.01); *H01L 2224/73204* (2013.01); *H05K 2201/09036* (2013.01); *H05K 2201/10075* (2013.01)

(56) References Cited

U.S. PATENT DOCUMENTS

| | | | |
|---|---|---|---|
| 7,859,348 B2 * | 12/2010 | Murase | H03H 9/0547 310/340 |
| 2004/0070462 A1 * | 4/2004 | Alhayek | H03H 3/02 331/158 |
| 2009/0261913 A1 | 10/2009 | Murase et al. | |
| 2011/0241043 A1 | 10/2011 | Nakayama | |

FOREIGN PATENT DOCUMENTS

| | | | |
|---|---|---|---|
| JP | 411260949 A * | 9/1999 | |
| JP | 2001-148436 A | 5/2001 | |
| JP | 2002-158305 A | 5/2002 | |
| JP | 2009-117495 A | 5/2009 | |
| JP | 2009-260644 A | 11/2009 | |
| JP | 2010-135711 A | 6/2010 | |
| TW | M403601 U1 | 5/2011 | |
| TW | 201143152 A1 | 12/2011 | |

OTHER PUBLICATIONS

JPO/ISA, International Search Report in corresponding international application No. PCT/JP2012/008151 mailed Jan. 29, 2013.

The State Intellectual Property Office of P.R. China, Notification of First Office Action issued in corresponding Chinese Application No. 201280056761.8, mailed Apr. 5, 2016.

* cited by examiner

CERAMIC PACKAGE

TECHNICAL FIELD

The present invention relates to a ceramic package having a cavity in which an electronic component such as a crystal oscillator, a semiconductor device, or a piezoelectric device is to be mounted, and whose opening can be reliably sealed.

BACKGROUND ART

There has been proposed, for example, a sealing structure of a ceramic package for enhancing the brazing strength of a metallic sealing ring which is brazed at the opening of a cavity of the ceramic package for sealing the cavity, the ceramic package including a first pattern of metalized layer which is formed, through printing, at the outer periphery of the cavity; a second pattern of thick film for receiving a brazing material which is formed, through printing, from a high-melting-point metal on the front surface of the first pattern so as to have a constant width and to extend along an intermediate portion of the first pattern in an inward/outward direction; a third pattern of thin metalized layer which is formed on the aforementioned two patterns so as to have a hat-shaped cross section in an inward/outward direction; the sealing ring (metallic frame) which is brazed onto the third pattern via a brazing material; and a cap (metallic cap) which is welded on the ring (see, for example, Patent Document 1).

Meanwhile, there has been proposed a package for accommodating an electronic component, in which a frame-shaped first metalized layer is formed on almost the entire front surface of an insulating substrate surrounding the opening of a dent (cavity) for accommodating an electronic component therein, the cavity having a quadrangular shape in plan view; and a belt-like second metalized layer having a width smaller than that of the first metalized layer is formed only on each of four side portions of the first metalized layer (i.e., other than corner portions of the front surface) such that the overall thickness of the first and second metalized layers becomes uniform between the aforementioned side portions and corner portions, so as to suppress deformation of a metallic frame brazed on the first and second metalized layers via a brazing material (see, for example, Patent Document 2).

However, when, as described in Patent Document 1, the second pattern of thick film having a constant thickness is formed so as to surround the opening of the cavity and to extend along the entire periphery of the cavity, the thickness of each of the four corner portions is greater than that of each of the four side portions. Therefore, when the sealing ring is brazed via the third pattern of thin metalized layer, the level of the front surface of the ring becomes uneven. Thus, even when a metallic cap is welded on the front surface of the ring, the cavity may fail to be sealed. In addition, since the aforementioned brazing material has a relatively large thickness at the corner portions, the ceramic material may be removed in the vicinity of the front surface at the corner portions, due to thermal stress in association with cooling of the brazing material during brazing of the ring, or due to thermal contraction of the metallic cap joined through welding.

Meanwhile, when, as described in Patent Document 2, the belt-like second metalized layer is formed only on each of the four side portions surrounding the opening of the cavity, a difference in level is generated between the straight side portions and the corner portions. Therefore, when a metallic frame is brazed onto the first and second metalized layers, the metallic frame may be inclined, and thus sealing of the cavity may fail to be achieved by means of a metallic cap welded on the metallic frame.

PRIOR ART DOCUMENT

Patent Document

Patent Document 1: Japanese Patent Application Laid-Open (kokai) No. H09-139439 (pages 1 to 6, FIGS. 1 to 6)
Patent Document 2: Japanese Patent Application Laid-Open (kokai) No. 2010-135711 (pages 1 to 15, FIGS. 1 to 4)

SUMMARY OF THE INVENTION

Problems to be Solved by the Invention

An object of the present invention is to solve the problems described in the BACKGROUND ART section, and to provide a ceramic package having a cavity in which an electronic component such as a crystal oscillator is mounted, and which realizes even joining of a metallic frame around the opening thereof, as well as reliable sealing thereof.

Means for Solving the Problems

In order to solve the aforementioned problems, the present invention has been achieved on the basis of the idea that a first metalized layer is formed on almost the entire front surface of a package main body surrounding the opening of a cavity, and a second metalized layer having a width smaller than that of the first metalized layer is formed on the front surface of the first metalized layer such that, for example, the width of the second metalized layer at a straight side portion differs from that at a corner portion.

Accordingly, the present invention provides a first ceramic package, comprising a package main body which is formed of a ceramic material, which has a front surface and a back surface, and which has a cavity opening toward the front surface; a first metalized layer which has a frame shape in plan view and is formed on the front surface; and a second metalized layer which is formed on the front surface of the first metalized layer so as to assume a frame shape, and which has a width smaller than that of the first metalized layer, the width being measured in an inward/outward direction of the package main body, the ceramic package being characterized in that the width, in the inward/outward direction, of the second metalized layer at a corner portion of the front surface in plan view is smaller than the width, in the inward/outward direction, of the second metalized layer in a region other than the corner portion in plan view.

Examples of the aforementioned ceramic material include high-temperature fired ceramic materials such as alumina, and low-temperature fired ceramic materials such as glass-ceramic materials.

As used herein, the "corner portion of the front surface" corresponds to a region defined by a pair of imaginary lines which are orthogonal with each other and which cross with both ends of a portion (having an arc shape in plan view) located at each of the corners of side walls of the cavity having a rectangular shape in plan view. In other words, the "region other than the corner portion" corresponds to a side portion of the front surface of the package main body, exclusive of the corner portion, which side portion extends along the sides of the front surface.

Alternatively, when the package main body and the cavity have an elongated circular shape in plan view, the "corner portion of the front surface" corresponds to a fan-shaped region (having a quarter-circular shape in plan view) in a pair of semicircular portions other than a pair of opposite straight side portions.

As used herein, the "inward/outward direction" refers to a radial direction connecting the center of the cavity (in plan view) of the package main body and the frame-shaped front surface surrounding the opening of the cavity.

When the ceramic material is a high-temperature fired ceramic material, each of the first metalized layer and the second metalized layer is formed of W, Mo, or an alloy thereof, whereas when the ceramic material is a low-temperature fired ceramic material, each of the first metalized layer and the second metalized layer is formed of, for example, Ag or Cu.

In the first ceramic package, the width of the second metalized layer at the corner portion is 20 to 80% the width of the second metalized layer at the side portion.

The front surface (exposed surface) of each of the first and second metalized layers is covered with a Ni plating film or an Au plating film.

The first ceramic package may be in the form of a multi-piece ceramic package array in which a plurality of ceramic packages are adjacently arranged in a matrix form in plan view.

The present invention also provides a second ceramic package, comprising a package main body which is formed of a ceramic material, which has a front surface and a back surface, and which has a cavity opening on the side toward the front surface; a first metalized layer which has a frame shape in plan view and is formed on the front surface; belt-like second metalized layers which are formed in a region, other than corner portions, of the front surface of the first metalized layer, and each of which has a width smaller than that of the first metalized layer, the width being measured in an inward/outward direction of the package main body; and a third metalized layer which has a circular shape in plan view, which is formed at each corner portion, and which is isolated from the adjacent belt-like second metalized layers, the ceramic package being characterized in that the diameter of the third metalized layer having a circular shape in plan view is smaller than the width, in the inward/outward direction, of the belt-like second metalized layers.

The front and back surfaces of the package main body of the second ceramic package generally have a quadrangular (square or rectangular) shape, but the shape of the front and back surfaces is not limited thereto. In the second ceramic package, the diameter of the circular third metalized layer located at each corner portion is smaller than the width of the belt-like second metalized layer located at each side portion. Specifically, the diameter of the third metalized layer is 20 to 80% the width of the second metalized layer. Preferably, the size of a gap through which only the first metalized layer is exposed, the gap being located between the circular third metalized layer and the adjacent belt-like second metalized layer, is three times or less the diameter of the third metalized layer, from the viewpoint of securing the fluidity of the below-described brazing material.

The second ceramic package may also be in the form of a multi-piece ceramic package array in which a plurality of ceramic packages are adjacently arranged in a matrix form in plan view.

The present invention provides a third ceramic package, comprising a package main body which is formed of a ceramic material, which has a front surface and a back surface, and which has a cavity opening toward the front surface; a first metalized layer which has a frame shape in plan view and is formed on the front surface; a second metalized layer which is formed on the front surface of the first metalized layer so as to assume a frame shape, and which has a width smaller than that of the first metalized layer, the width being measured in an inward/outward direction of the package main body; and a metallic frame which is joined, via a brazing material, over the first metalized layer and the second metalized layer, the ceramic package being characterized in that an inclination angle formed, at a corner portion of the front surface in plan view, between the front surface of the first metalized layer and the outer side surface of the brazing material which is located above the first metalized layer and outside the second metalized layer is smaller than an inclination angle formed, in a region of the front surface other than the corner portion in plan view, between the front surface of the first metalized layer and the outer side surface of the brazing material which is located above the first metalized layer and outside the second metalized layer.

The third ceramic package is produced by joining a metallic frame, via a brazing material, over the first metalized layer and the second metalized layer of the first ceramic package.

In the third ceramic package, the outer side surface of the brazing material at each corner portion is a curved surface which is convex downward in side view (a so-called fillet). Meanwhile, the outer side surface of the brazing material at each side portion is a curved surface which is convex upward or downward in side view. The upper end of the outer side surface of the brazing material may extend to the outer side surface of the second metalized layer.

Alternatively, the outer side surface of the brazing material may bend at an intermediate portion of a vertical cross section.

The aforementioned metallic frame (ring-shaped metal fitting) may be formed of, for example, Kovar (Fe—29 wt % Ni—17 wt % Co), 42 alloy (Fe—42 wt % Ni), or 194 alloy (Cu—2.3 wt % Fe—0.03 wt % P). The aforementioned brazing material may be, for example, Ag brazing material (Ag—15 wt % Cu).

The front surface of the first metalized layer corresponds to an imaginary horizontal surface for determining the aforementioned inclination angle, and the outer side surface of the brazing material located outside the second metalized layer corresponds to an imaginary tangent line extending obliquely upward from the outer edge of the outer side surface in an inward/outward direction.

The present invention also encompasses a ceramic package wherein the second metalized layer formed on the front surface of the first metalized layer is located, in the inward/outward direction of the package main body, nearer to one end of the front surface on the side toward the cavity than to the other end of the front surface on the side toward the outer side surface of the first metalized layer of the package main body; and the position of the second metalized layer at a corner portion in the inward/outward direction is nearer to the one end of the front surface on the side toward the cavity, as compared with the position, in the inward/outward direction, of the second metalized layer in a region of the front surface other than the corner portion.

The aforementioned region corresponds to a side portion of the front surface of the first metalized layer other than each corner portion.

The present invention also encompasses a ceramic package wherein the package main body has, on the back surface thereof, an additional cavity similar to that on the front surface, and the additional cavity is symmetric with the cavity opening toward the front surface.

The ceramic package including the package main body having, on the front surface thereof, the cavity, the first and second metalized layers, the brazing material, and the brazed metallic frame, and also having the cavity opening toward the back surface of the package main body may be in the form of a multi-piece ceramic package array.

Effects of the Invention

According to one exemplary embodiment of the ceramic package of the present invention, the second metalized layer is formed such that the width, in the inward/outward direction, of the layer at a corner portion of the front surface having a frame shape in plan view is smaller than the width, in the inward/outward direction, of the layer in a region (straight side portion) other than the corner portion in plan view. Thus, the thickness of the second metalized layer is relatively uniform at the corner portion and the side portion (i.e., other than the corner portion), as compared with the case where the second metalized layer is formed so as to have the same width at the entire periphery of the front surface as described in Patent Document 1. Therefore, a metallic frame will be able to be readily joined through brazing evenly over the first and second metalized layers so that the metallic frame is parallel to the front surface of the package main body.

In addition, since the thickness of the second metalized layer located at the corner portion becomes smaller than that in the aforementioned conventional case where the second metalized layer is formed so as to have the same width on the entire front surface, a difference between the thickness of the second metalized layer at the corner portion and that at the side portion is reduced; i.e., the second metalized layer has a uniform thickness at all the corner portions and side portions. Therefore, when an unfired package main body prepared by stacking a plurality of green sheets is fired upon production of the ceramic package, a problem in terms of upward warpage of the front surface at the corner portion is prevented.

Furthermore, at each corner portion, a space located above the first metalized layer and outside the second metalized layer in which a brazing material is to be supplied for brazing of the metallic frame has a cross section having a smaller thickness and a larger width in the inward/outward direction, as compared with conventional cases. Therefore, even when a brazing material for joining of the metallic frame is supplied in the space in an amount almost equal to that in conventional cases, the metallic frame can be joined to the layers at high brazing strength without generating voids in the brazing material, and removal of the ceramic material in the vicinity of the front surface, which would otherwise occur due to thermal stress in association with the aforementioned brazing, can be suppressed.

According to one exemplary embodiment of the ceramic package of the present invention, the belt-like second metalized layer is formed on the front surface of the first metalized layer in a region (side portion) other than the corner portion of the front surface having a frame shape in plan view, and the third metalized layer having a circular shape in plan view and having a diameter smaller than the width of the belt-like second metalized layer is formed at the corner portion so as to be isolated from the adjacent belt-like second metalized layer. Thus, the circular third metalized layer located at each corner portion and the belt-like second metalized layer located at each side portion have a relatively uniform thickness. Therefore, a metallic frame will be able to be readily joined through brazing evenly over the first and second metalized layers so that the metallic frame is parallel to the front surface of the package main body.

In addition, since the thickness of the circular third metalized layer located at the corner portion becomes smaller than that in the aforementioned conventional case where the metalized layer is formed so as to have the same width on the entire front surface, a difference between the thickness of the metalized layer at the corner portion and that at the side portion is reduced; i.e., the second and third metalized layers have a uniform thickness at all the corner portions and side portions. Therefore, when an unfired package main body prepared by stacking a plurality of green sheets is fired upon production of the ceramic package, a problem in terms of upward warpage of the corner portion can be prevented.

Furthermore, at each corner portion, a space located above the first metalized layer and outside the circular third metalized layer in which a brazing material is to be supplied for brazing of the metallic frame has a cross section having a smaller thickness and a larger width in the inward/outward direction, as compared with conventional cases. Therefore, even when a brazing material for joining of the metallic frame is supplied in the space in an amount equal to that in conventional cases, the metallic frame can be joined to the layers at high brazing strength without generating voids in the brazing material, and removal of the ceramic material in the vicinity of the front surface, which would otherwise occur due to thermal stress in association with brazing of the metallic frame, can be suppressed.

According to one exemplary embodiment of the ceramic package of the present invention, the inclination angle between the front surface of the first metalized layer and the outer side surface of the brazing material which is located, at each corner portion of the front surface, above the first metalized layer and outside the second metalized layer is smaller than the inclination angle between the front surface of the first metalized layer and the outer side surface of the brazing material which is located, in a region of the front surface other than the corner portion in plan view, above the first metalized layer and outside the second metalized layer. In other words, the brazing material located outside the second metalized layer at each corner portion has a smaller thickness and a larger width in the inward/outward direction, as compared with the brazing material located outside the second metalized layer at each side portion, whereby the first metalized layer and the metallic frame are joined together at a relatively high brazing strength. Therefore, the metallic frame can be evenly and strongly joined to the front surface of the package main body, and the metallic frame can be reliably sealed with a metallic cap through, for example, welding. In addition, since insufficient supply of molten brazing material can be prevented at the corner portion, generation of voids (defects), which would otherwise occur due to insufficient supply of the brazing material, can be prevented at the entire periphery of the front surface of the package main body.

According one exemplary embodiment of the ceramic package of the present invention, the second metalized layer formed on the front surface of the first metalized layer is located, in plan view, nearer to the cavity-side end of the first metalized layer, and the position of the second metalized layer at each corner portion is nearer to the cavity-side end of the first metalized layer, as compared with the position of the second metalized layer in a region other than the corner portion. Thus, in conjunction with the aforementioned smaller width of the second metalized layer at the corner portion, a space located above the first metalized layer and outside the second metalized layer in which a brazing material is to be supplied for brazing of the metallic frame has a cross section having a smaller thickness and a larger width in the inward/outward direction, as compared with conventional cases. Therefore, even when a brazing material for joining of the metallic frame is supplied in the space in an amount almost equal to that in conventional cases, the metallic frame can be joined to the layers at high brazing strength without generating voids in the brazing material, and removal of the ceramic material in the vicinity of the front surface, which would otherwise occur due to thermal stress in association with brazing of the metallic frame, can be reliably prevented.

According one exemplary embodiment of the ceramic package of the present invention, since cavities are provided on both the front-surface side and the back-surface side of the package main body, an electronic component (e.g., an IC chip) which, unlike a crystal oscillator, etc. mounted in the cavity opening toward the front surface, does not require sealing, can be mounted on the bottom surface (ceiling surface) of the cavity opening toward the back surface.

MODES FOR CARRYING OUT THE INVENTION

Embodiments of the present invention will next be described.

Figure 1:
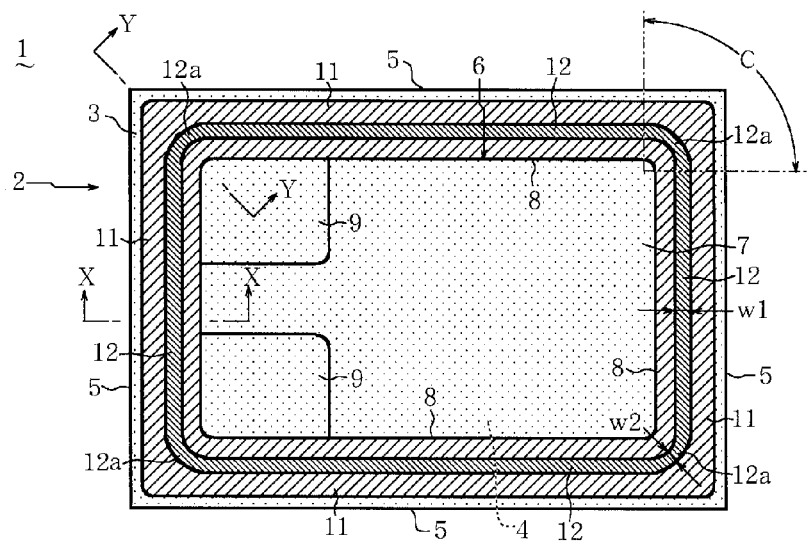
FIG. 1 is a plan view of a first ceramic package according to the present invention.
Figure 2:
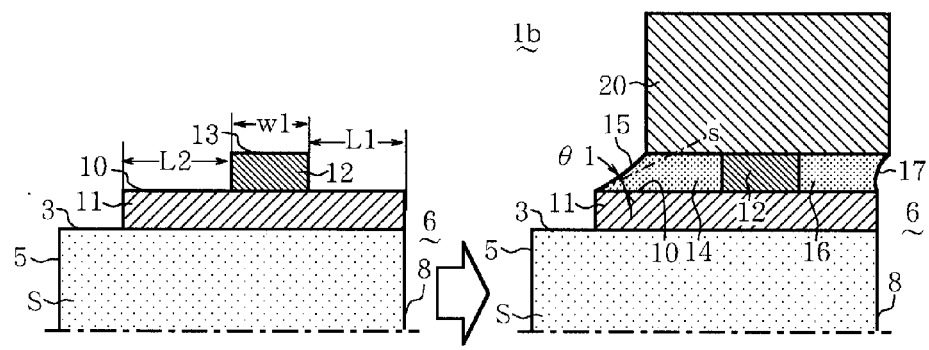
FIG. 2 is a partially enlarged cross-sectional view of a side portion of the ceramic package of FIG. 1 taken along line X-X, as well as a partial cross-sectional view of the same portion of a third ceramic package.

FIG. 1 is a plan view of a first ceramic package 1 according to the present invention; FIG. 2 (left side) is a partially enlarged cross-sectional view of the ceramic package of FIG. 1 taken along line X-X; and FIG. 3 (left side) is a partially enlarged cross-sectional view of the ceramic package of FIG. 1 taken along line Y-Y.

Figure 3:
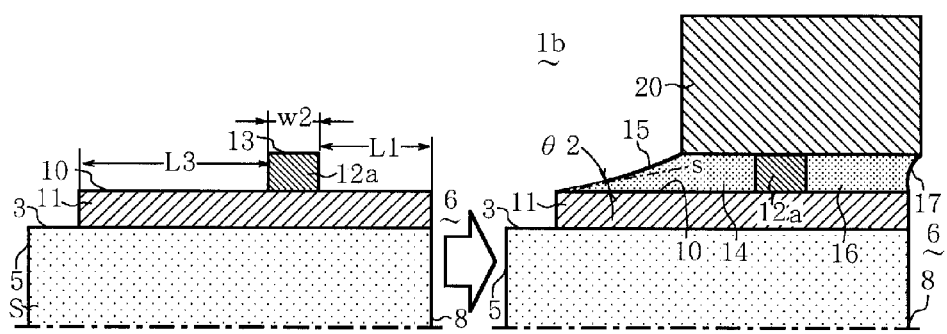
FIG. 3 is a partially enlarged cross-sectional view of a corner portion of the ceramic package of FIG. 1 taken along line Y-Y, as well as a partial cross-sectional view of the same portion of a third ceramic package.

As shown in FIGS. 1 to 3, the first ceramic package 1 includes a package main body 2 which has a front surface 3 having a frame shape in plan view, a back surface 4 having a rectangular shape in plan view, and a cavity 6 opening toward the front surface 3; and a first metalized layer 11 and a second metalized layer 12 which are formed on the front surface 3.

The package main body 2 is a box-shaped body having four outer side surfaces 5 and is produced by stacking a plurality of ceramic layers formed of a ceramic material S such as alumina. The cavity 6 is defined by a bottom surface 7 having a rectangular shape in plan view and having four arcuate corners; four side walls 8 having four arcuate corner surfaces; and a pair of adjacent bases 9 projecting from the short side wall 8 located on the left side of FIG. 1. On each of the front surfaces of the paired bases 9 is formed an electrode (not illustrated) which is connected to an external terminal of an electronic component (e.g., a crystal oscillator) to be mounted. The electrode is formed of, for example, W or Mo.

As shown in FIG. 1, FIG. 2 (left side), and FIG. 3 (left side), the first metalized layer 11 is formed on almost the entire front surface 3 so as to have a relatively uniform thickness.

Meanwhile, the second metalized layer 12 formed in regions of the front surface 3 other than four corner portions C thereof (hereinafter the regions may be referred to as "side portions") has a width w1 (in the inward/outward direction of the package main body 2) smaller than that of the first metalized layer 11, and the width w2 (in the inward/outward direction) of a second metalized layer 12a located at each corner portion C is smaller than the width w1. Specifically, the width w2 of the second metalized layer 12a at the corner portion C is 20 to 80% the width w1 of the second metalized layer at each side portion. The second metalized layer 12a located at each corner portion C in plan view is formed in such a pattern that the outer curved surface further approaches the inner curved surface in plan view, as compared with the case of the second metalized layer 12 at each side portion.

In addition, as shown in FIG. 2 (left side), the second metalized layer 12 formed at each side portion of the front surface 3 is located, in the inward/outward direction of the package main body 2 (i.e., in the inward/outward direction of the first metalized layer 11), nearer to the end of the layer 11 on the side toward the cavity 6 such that the distance L1 between the layer 12 and the cavity-side end is smaller than the distance L2 between the layer 12 and the end of the layer 11 on the side toward the outer side surface 5 of the package main body 2.

Also, as shown in FIG. 3 (left side), the second metalized layer 12a formed at each corner portion C of the front surface 3 is located, in the inward/outward direction of the package main body 2 (i.e., in the inward/outward direction of the first metalized layer 11), nearer to the end of the layer 11 on the side toward the cavity 6 than to the end of the layer 11 on the side toward the outer side surface 5 of the package main body 2 such that the distance L1 between the layer 12a and the cavity-side end is smaller than the distance L3 between the layer 12a and the end of the layer 11 on the side toward the outer side surface 5 of the package main body 2.

The first and second metalized layers 11, 12, and 12a are also formed of, for example, W or Mo. The front surface (exposed surface) of each of these layers is covered with only an Ni plating film, or both an Ni plating film and an Au plating film. As shown in FIG. 1 (upper right side), the corner portion C corresponds to a region defined by a pair of virtual dashed lines which are orthogonal with each other and which cross with both ends of a portion (having an arc shape in plan view) located at each of the corners of side walls 8, 8 of the cavity 6.

The first metalized layer 11 is connected to one end of a via conductor vertically penetrating at least one of the side walls of the package main body 2 surrounding the cavity 6, and the via conductor is electrically connected to an external terminal (not illustrated) on the side toward the back surface 4 which is electrically conducted to each of the terminals of the bases 9.

In addition, the first metalized layer 11 is formed on the frame-shaped front surface 3 such that the layer 11 is located slightly distant from the four outer side surfaces 5 of the package main body 2. The reason for this is as follows. In the case where a plurality of ceramic packages 1 are adjacently arranged in a matrix form in plan view to thereby form a multi-piece ceramic package array, when the below-described brazing materials applied onto the first and second metalized layers 11 and 12 of adjacent ceramic packages 1, 1, are melted for joining a metallic frame over the layers, there can be prevented a problem that the brazing materials are bridged with each other.

As shown in FIGS. 2 and 3 (right side), a sheet-like, frame-shaped brazing material which had been preformed in advance was applied to the first ceramic package 1 so as to cover the Ni-plated first and second metalized layers 11, 12, and 12a formed on the frame-shaped front surface 3, and a metallic frame 20 was placed on the brazing material, followed by melting of the brazing material through heating. The brazing material is formed of, for example, Ag brazing material (Ag—15 wt % Cu). The metallic frame 20 is formed of, for example, Kovar, and has a rectangular frame shape in plan view.

Thus, as shown in FIGS. 2 and 3, there was produced a third ceramic package 1b including the metallic frame (ring) 20 having a rectangular frame shape in plan view and joined via the brazing materials 14 and 16 provided above the first metalized layer 11 and outside and inside the second metalized layers 12 and 12a. Inside the second metalized layers 12 and 12a at the side portion and the corner portion C of the front surface 3, the brazing material 16 having a similar cross section and a vertically elongated curved surface 17 facing toward the cavity 6 was solidified in a space defined by the first and second metalized layers 11, 12, and 12a and the metallic frame 20.

Meanwhile, as shown in FIG. 2 (right side) and FIG. 3 (right side), there was solidified the brazing material 14 outside the second metalized layers 12 and 12a at the side portion and the corner portion C of the front surface 3, the brazing material 14 being surrounded by the second metalized layers 12 and 12a, the front surface 10 of the first metalized layer 11, and the metallic frame 20, and having a curved outer side surface 15 which is convex downward between the outermost portion of the first metalized layer 11 and the outermost portion of the metallic frame 20.

As shown in FIGS. 2 and 3, the inclination angle $\theta 2$ between the front surface 10 of the first metalized layer 11 and the tangent line s at the outermost edge of the outer side surface 15 of the brazing material 14 at the corner portion C was smaller than the inclination angle $\theta 1$ between the front surface 10 of the first metalized layer 11 and the tangent line s at the outermost edge of the outer side surface 15 of the brazing material 14 at the side portion.

The reason why the inclination angle $\theta 2$ was smaller than the inclination angle $\theta 1$ is attributed to the fact that the width w2 of the second metalized layer 12a at the corner portion C was smaller than the width w1 of the second metalized layer 12 at the side portion; the second metalized layer 12a at the corner portion C was located, in the inward/outward direction of the front surface 3, nearer to the cavity 6 than the second metalized layer 12 at the side portion; and a relatively wide space was provided outside the second metalized layer 12a at the corner portion C. In addition, since, outside the second metalized layer 12a at the corner portion C, the first metalized layer 11 projected outward from the outer side surface of the metallic frame 20 in the inward/outward direction, as compared with the case at the side portion, the relatively thin brazing material 14 having the slightly inclined outer side surface 15 was formed on the front surface 10 of the first metalized layer 11.

Thus, the joining strength between the first metalized layer 11 and the metallic frame 20 was increased by means of the brazing material 14 at the corner portion C, and the outside brazing material 14 was continuously formed at the entire periphery of the front surface 3 without generating voids.

The front surface 10 of the first metalized layer 11 corresponds to an imaginary line parallel to the front surface 3 of the package main body 2. The outermost thin portion of the brazing material 14 having the outer side surface 15 is a so-called fillet.

According to the first ceramic package 1, since the second metalized layers 12 and 12a are formed such that the width w2 (in the inward/outward direction) at the corner portion C of the front surface 3 having a frame shape in plan view is smaller than the width w1 (in the inward/outward direction) at the side portion, the thicknesses of the second metalized layers 12 and 12a are relatively uniform at the corner portion C and the side portion. Therefore, the metallic frame 20 will be able to be joined through brazing over the first and second metalized layers 11 and 12 so that the metallic frame 20 is parallel to the front surface 3 of the package main body 2.

In addition, since the thickness of the second metalized layer 12a at the corner portion C becomes smaller than that in the conventional case where the second metalized layer is formed so as to have the same width on the entire front surface, a difference between the thicknesses of the second metalized layers at the corner portion C and at the side portion is reduced; i.e., the second metalized layers 12 and 12a have a uniform thickness on the entire front surface 3. Therefore, when an unfired package main body prepared by stacking a plurality of green sheets is fired upon production of the ceramic package, a problem in terms of upward warpage of a portion in the vicinity of the front surface 3 at the corner portion C is prevented.

Furthermore, a space located outside the second metalized layer 12a at the corner portion C in which the brazing material 14 is to be supplied for brazing of the metallic frame 20 has a cross section having a smaller thickness and a slightly larger width in the inward/outward direction, as compared with conventional cases. Therefore, even when the brazing material 14 for joining of the metallic frame 20 is supplied in the space in an amount almost equal to that in conventional cases, the metallic frame 20 can be joined to the layers at high brazing strength without generating voids in the brazing material 14, and removal of the ceramic material S in the vicinity of the front surface 3, which would otherwise occur due to thermal stress in association with the aforementioned brazing, can be suppressed.

Meanwhile, according to the third ceramic package 1b produced through brazing of the metallic frame 20 onto the first ceramic package 1, as shown in the aforementioned inclination angle relationship ($\theta 2 < \theta 1$), the brazing material 14 located outside the second metalized layer 12a at the corner portion C has a smaller thickness and a larger width in the inward/outward direction, as compared with the brazing material 14 located outside the second metalized layer 12 at the side portion, whereby the first metalized layer 11 and the metallic frame 20 are joined together at a relatively high brazing strength. Therefore, the metallic frame 20 can be evenly joined to the front surface 3 of the package main body 2, and the metallic frame 20 can be reliably sealed with a metallic cap through, for example, welding. In addition, since insufficient supply of the brazing material 14 (in association with melting) can be prevented outside the second metalized layer 12*a* at the corner portion C, insufficient filling, which would otherwise occur due to insufficient supply of the brazing material, can be prevented at the entire periphery of the front surface 3 of the package main body 2.

Figure 4:
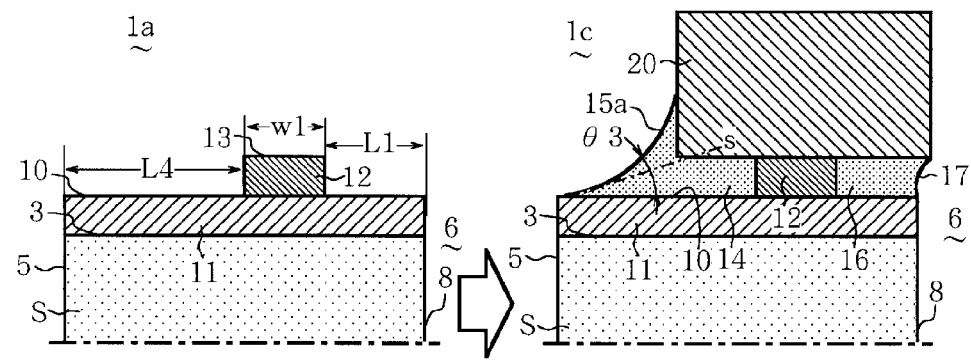
FIG. 4 is a partially enlarged cross-sectional view of a portion (similar to that shown in FIG. 2) of a first ceramic package according to a different embodiment, as well as a partial cross-sectional view of the same portion of a third ceramic package.
Figure 5:
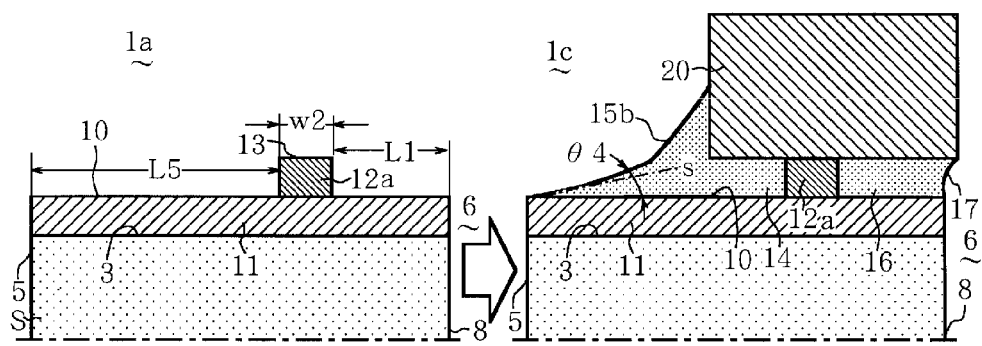
FIG. 5 is a partially enlarged cross-sectional view of a portion (similar to that shown in FIG. 3) of a first ceramic package according to a different embodiment, as well as a partial cross-sectional view of the same portion of a third ceramic package.

FIGS. 4 and 5 show a first ceramic package 1*a*, which is an embodiment different from the aforementioned package 1, and a third ceramic package 1*c* (different embodiment) produced through joining of the metallic frame 20 through brazing onto the package 1*a* in the same manner as described above.

As shown in FIG. 4 (left side), in the first ceramic package 1*a*, the first metalized layer 11 is formed at the entire side portion of the front surface 3 of the package main body 2, and the second metalized layer 12 having the same width w1 as described above is formed on the front surface 10 of the first metalized layer 11 located at the side portion such that, as in the aforementioned case, the distance L1 between the layer 12 and the cavity 6-side end is smaller than the distance L4 between the layer 12 and the end on the side toward the outer side surface 5 of the package main body 2.

As shown in FIG. 5 (left side), in the first ceramic package 1*a*, the first metalized layer 11 is formed at the entire corner portion C of the front surface 3 of the package main body 2, and the second metalized layer 12*a* having the same width w1 as described above is formed on the front surface 10 of the first metalized layer 11 located at the corner portion C such that the distance L1 between the layer 12*a* and the cavity 6-side end is smaller than the distance L5 between the layer 12*a* and the end on the side toward the outer side surface 5 of the package main body 2. The first ceramic package 1*a* can exhibit effects similar to those obtained by the aforementioned package 1.

As shown in FIGS. 4 and 5 (right side), a brazing material which had been preformed in advance was applied to the first ceramic package 1*a* so as to cover the Ni-plated first and second metalized layers 11, 12, and 12*a* formed on the frame-shaped front surface 3, and the metallic frame 20 was placed on the brazing material, followed by melting of the brazing material through heating.

Thus, as shown in FIGS. 4 and 5 (right side), there was produced a third ceramic package 1*c* (different embodiment) including the metallic frame 20 having a rectangular frame shape in plan view and joined via the brazing materials 14 and 16 provided above the first metalized layer 11 and outside and inside the second metalized layers 12 and 12*a*. Specifically, as shown in FIGS. 4 and 5 (right side), there was solidified the brazing material 14 outside the second metalized layers 12 and 12*a* at the side portion and the corner portion C of the front surface 3, the brazing material 14 being surrounded by the second metalized layers 12 and 12*a*, the front surface 10 of the first metalized layer 11, and the metallic frame 20, and having a curved outer side surface 15*a* convex downward between the outermost portion of the first metalized layer 11 and the outermost portion of the metallic frame 20, or having an outer side surface 15*b* bent at an intermediate portion thereof.

Also, the inclination angle θ4 between the front surface 10 of the first metalized layer 11 and the tangent line s at the outermost edge of the outer side surface 15 of the brazing material 14 at the corner portion C was smaller than the inclination angle θ3 between the front surface 10 of the first metalized layer 11 and the tangent line s at the outermost edge of the outer side surface 15 of the brazing material 14 at the side portion (θ3>θ4), for the same reason as described above.

The third ceramic package 1*c* can exhibit effects similar to those obtained by the aforementioned package 1*b*.

Figure 6:
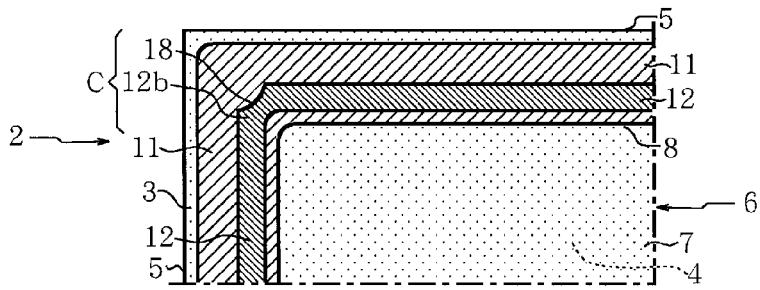
FIG. 6 is a partial plan view of a second metalized layer at a corner portion according to a different embodiment.

FIG. 6 is a partial plan view of a second metalized layer 12*b* (different embodiment) at the corner portion C of the first ceramic package 1. Specifically, as shown in FIG. 6, the belt-like second metalized layer 12 is formed at each side portion of the first metalized layer 11 formed on almost the entire frame-shaped front surface 3 of the package main body 2 such that the layer 12 extends along a position nearer to the end toward the cavity 6 in the inward/outward direction of the front surface 3. In addition, the second metalized layer 12*b* at the corner portion C is orthogonally connected to the two adjacent second metalized layers 12 and has a dent 18 formed outside the connection portion, the dent 18 having an arc shape in plan view.

Figure 7:
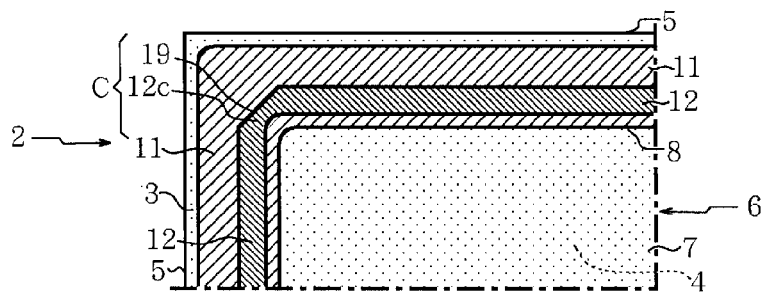
FIG. 7 is a partial plan view of a second metalized layer at a corner portion according to another embodiment.

FIG. 7 is a partial plan view of a second metalized layer 12*c* (different embodiment) at the corner portion C of the first ceramic package 1.

Specifically, as shown in FIG. 7, the belt-like second metalized layer 12 is formed at each side portion of the first metalized layer 11 formed on the front surface 3 in the same manner as described above such that the layer 12 extends along a position nearer to the end toward the cavity 6 in the inward/outward direction. In addition, the second metalized layer 12*c* at the corner portion C is orthogonally connected to the two adjacent (in plan view) second metalized layers 12 and has a chamfer 19 formed outside the connection portion, the chamfer 19 obliquely crossing with the layers 12 at about 45° in plan view.

Figure 8:
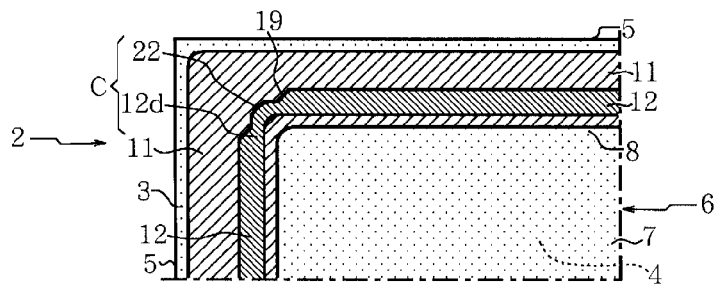
FIG. 8 is a partial plan view of a second metalized layer at a corner portion according to yet another embodiment.

FIG. 8 is a partial plan view of a second metalized layer 12*d* (different embodiment) at the corner portion C of the first ceramic package 1.

Specifically, as shown in FIG. 8, the belt-like second metalized layer 12 is formed at each side portion of the first metalized layer 11 formed on the front surface 3 in the same manner as described above such that the layer 12 extends along a position nearer to the end toward the cavity 6 in the inward/outward direction. In addition, the second metalized layer 12*d* at the corner portion C is orthogonally connected to the two adjacent (in plan view) second metalized layers 12 and has a chamfer 19 (similar to that described above) formed outside the connection portion, as well as an arcuate protrusion 22 which slightly projects from an intermediate portion of the chamfer toward the outside and which is curved in parallel to the inner surface of the layer 12*d*.

Since each of the second metalized layers 12*b*, 12*c*, and 12*d* at the corner portion C is also formed such that the width (in the inward/outward direction) of the front surface 3 is smaller than the width w1 (in the inward/outward direction) of the second metalized layer 12 at the side portion, the thicknesses of the second metalized layer 12 and each of the layers 12*b* to 12*d* are relatively uniform at the entire periphery of the front surface 3, as compared with the case where the second metalized layer is formed so as to have the same width at the entire periphery of the front surface.

Therefore, the thus-produced ceramic package can exhibit effects similar to those obtained by the first ceramic package 1 including the second metalized layer 12*a* formed at the corner portion C. In addition, when the metallic frame 20 is joined to the metalized layers 11 and 12 via the brazing materials 14 and 16, the resultant ceramic package can exhibit effects similar to those obtained by the third ceramic package 1*b* or 1*c*.

Figure 9:
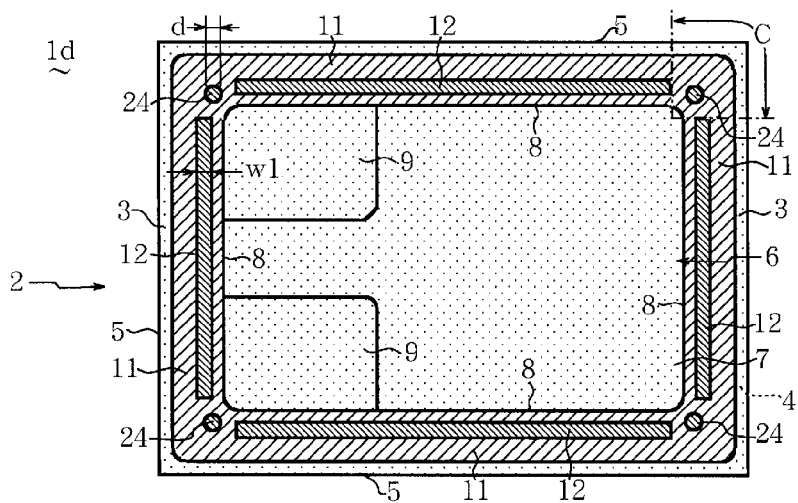
FIG. 9 is a plan view of a second ceramic package according to the present invention.

FIG. 9 is a plan view of a second ceramic package 1*d* according to the present invention.

As shown in FIG. 9, the second ceramic package 1*d* includes a package main body 2 similar to that described above; a first metalized layer 11 which has a frame shape in plan view and is formed on the front surface 3 in a manner similar to that described above; a belt-like second metalized layer 12 which is formed at each side portion (other than a corner portion C of the front surface 3) of the first metalized layer 11 such that the layer 12 extends in a longitudinal direction and extends parallel to a position nearer to the end toward the cavity 6 in the inward/outward direction; and a third metalized layer 24 which has a circular shape in plan view, which is formed on the first metalized layer 11 at each corner portion C of the front surface 3, and which is isolated from the adjacent belt-like second metalized layer 12.

The diameter d of the circular third metalized layer 24 is smaller than the width w1 (in the inward/outward direction) of the belt-like second metalized layer 12. Specifically, the diameter d of the circular third metalized layer 24 at the corner portion C is 20 to 80% the width w1 of the second metalized layer 12 located at the side portion.

Preferably, the size of a gap between the circular third metalized layer 24 and the adjacent belt-like second metalized layer 12 is at least equal to or larger than the aforementioned diameter d and three times or less the diameter d, from the viewpoint of securing the fluidity (in the inward/outward direction) of an appropriate amount of the brazing material at the corner portion C. Also, preferably, the center of the circular third metalized layer 24 is located in the vicinity of a crossing point of imaginary lines extending from the inner side surfaces of a pair of orthogonally adjacent belt-like second metalized layers 12, from the aforementioned viewpoint and the viewpoint of the width of the externally employed brazing material 16.

A metallic frame 20 similar to that described above was applied to the aforementioned second ceramic package 1d via the aforementioned brazing material provided above the first metalized layer 11, the belt-like second metalized layer 12, and the circular third metalized layer 24 on the frame-shaped front surface 3, and then the brazing material was melted and solidified.

Thus, as in the cases shown in FIGS. 2 to 5 (right side), there was produced a third ceramic package similar to that described above, the package including the brazing material 14 which is located outside each of the second and third metalized layers 12 and 24 at the side portion and the corner portion C, and which has the outer side surfaces 15, 15a, and 15b having the aforementioned inclination angles θ1 to θ4.

Also, in the aforementioned second ceramic package 1d, since the thicknesses of the circular third metalized layer 24 at the corner portion C and the belt-like second metalized layer 12 at the side portion are relatively uniform, the metallic frame 20 will be able to be reliably joined through brazing onto the first, second, and third metalized layers 11, 12, and 24 so that the metallic frame 20 is parallel to the front surface 3 of the package main body 2.

In addition, since the thickness of the circular third metalized layer 24 at the corner portion C becomes smaller than that in the conventional case where the metalized layer is formed so as to have the same width on the entire front surface, a difference between the thicknesses of the metalized layers at the corner portion and at the side portion is reduced; i.e., the second and third metalized layers 12 and 24 have a uniform thickness on the entire front surface 3 of the package main body 2. Therefore, when an unfired package main body prepared by stacking a plurality of green sheets is fired upon production of the ceramic package, a problem in terms of upward warpage of the corner portion C can be prevented.

Furthermore, a space located outside the second metalized layer at the corner portion C in which the brazing material 14 is to be supplied for joining of the metallic frame 20 has a cross section having a large width in the inward/outward direction. Therefore, even when the brazing material 14 for joining of the metallic frame 20 is thinly applied to the space in an amount almost equal to that in conventional cases, the metallic frame 20 can be joined to the metalized layers at high brazing strength without generating voids in the brazing material 14, and removal of the ceramic material S in the vicinity of the front surface 3, which would otherwise occur due to thermal stress in association with the aforementioned brazing, can be suppressed.

Two or more circular third metalized layers 24 may be provided at a single corner portion C such that they are isolated from one another. Alternatively, the third metalized layer 24 may have an elongated circular or elliptical shape in plan view, such that the major axis extends along the shortest imaginary line between ends of a pair of adjacent second metalized layers 12, 12, and the minor axis extends in the inward/outward direction.

Figure 10:
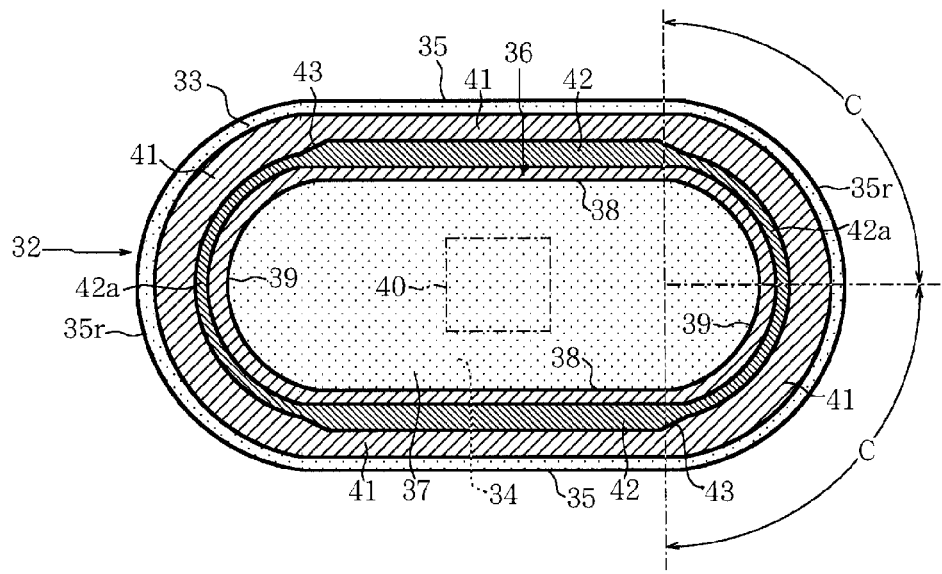
FIG. 10 is a plan view of a first ceramic package according to another embodiment.

FIG. 10 is a plan view of a ceramic package 30, which is an applied embodiment of the aforementioned first ceramic package 1. As shown in FIG. 10, the ceramic package 30 includes a package main body 32 which is formed of a ceramic material similar to that described above, which has an elongated circular shape in plan view, and which has a front surface 33 and a back surface 34; a cavity 36 which has an elongated circular shape in plan view and which is open toward the front surface 33 having an elongated circular frame shape in plan view; a first metalized layer 41 formed on almost the entire front surface 33; and second metalized layers 42 and 42a which are formed on the first metalized layer 41 so as to extend on the side toward the cavity 36, and which have a smaller width.

The cavity 36 is defined by a bottom surface 37 having an elongated circular shape in plan view, and elongated circular cylindrical side walls 38 and 39 rising from the periphery of the bottom surface 37. As shown in FIG. 10, a pair of left and right side walls 39 having a semicircular shape in plan view are located between a pair of upper and lower flat side walls 38, 38, and two corner portions C (including each side wall 39) are continuously provided so as to extend in the inward/outward direction. The bottom surface 37 has, on the center thereof, a portion 40 for mounting, for example, a light-emitting device.

The package main body 32 also has a pair of flat outer side surfaces 35, and a pair of semicircular cylindrical outer side surfaces 35r.

As shown in FIG. 10, the belt-like second metalized layer 42 which has a relatively large width and which is located nearer to the end on the side toward the cavity 36 than to the outer side surface 35 is provided at each side portion of the first metalized layer 41 formed on the front surface 33 having an elongated circular frame shape in plan view, and the semicircular second metalized layer 42a which has a width smaller than that of the second metalized layer 42 and which is located nearer to the end on the side toward the side wall 39 of the cavity 36 than to the outer side surface 35r is provided at each of the left and side corner portions C, C. A inclined side surface 43 (corresponding to the difference in width between the two metalized layers 42 and 42a) is located between outer side surfaces of the second metalized layers 42 and 42a. Similar to the case described above, the first metalized layer 41 and the second metalized layers 42 and 42a are formed of W or Mo.

The first ceramic package 30 can exhibit effects similar to those obtained by the aforementioned first ceramic package 1 or 1a. When a light-emitting device (e.g., a light-emitting diode) is mounted in the cavity 36, the cavity can be reliably sealed with a translucent sealing resin will be provided above the light-emitting device.

Similar to the case described above, the front surface (exposed surface) of each of the first and second metalized layers 41, 42, and 42a is covered with only an Ni plating film, or both an Ni plating film and an Au plating film. A metallic frame having an elongated circular frame shape in plan view is to be joined onto the first and second metalized layers 41, 42, and 42a via a brazing material similar to that described above.

Figure 11:
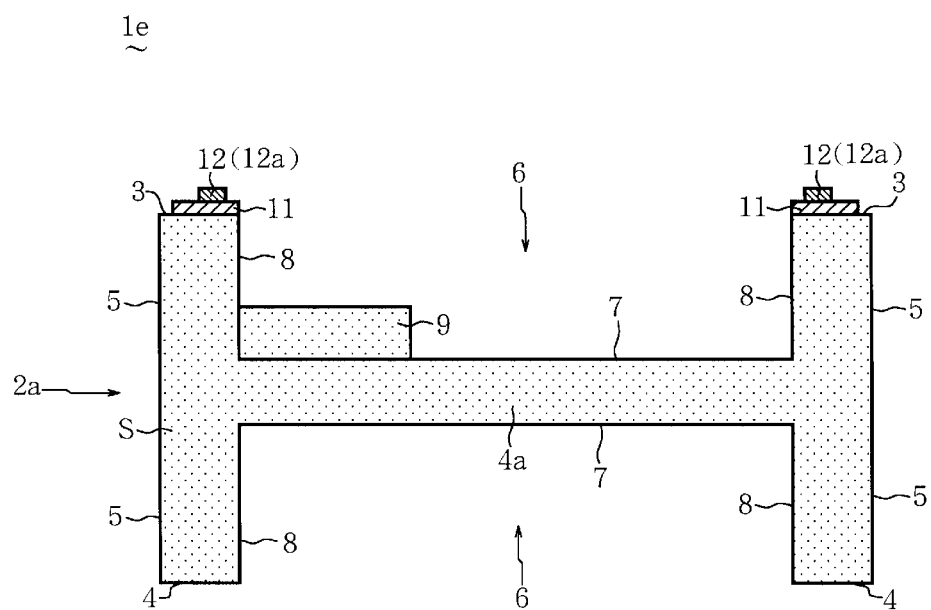
FIG. 11 is a vertical cross-sectional view of an applied embodiment of the first ceramic package.

FIG. 11 is a vertical cross-sectional view of a ceramic package 1e, which is another applied embodiment of the aforementioned first ceramic package 1. As shown in FIG. 11, the package 1e includes a package main body 2a having a cavity 6 which is open toward the front surface 3 in the same manner as described above, and also a cavity 6 which is open toward the back surface 4 and is symmetric with the front-surface-opening cavity 6.

A ceramic partition plate 4a is provided between the bottom surfaces 7, 7 of the paired cavities 6, 6, and a non-illustrated via conductor penetrates therethrough.

According to the ceramic package 1e, an electronic component (e.g., an IC chip) which does not require sealing can be further mounted on the bottom surface 7 of the cavity 6 opening toward the back surface 4.

The back surface 34 of the aforementioned ceramic package 30 may have thereon a cavity 36 formed so as to be symmetric with the cavity 36 opening toward the front surface 33.

The present invention is not limited to the above-described embodiments.

For example, the ceramic material forming the aforementioned package main body may be a high-temperature fired ceramic material other than alumina (e.g., mullite or aluminum nitride), or may be glass-ceramic material (i.e., a low-temperature fired ceramic material).

When the ceramic material is a low-temperature fired ceramic material, the aforementioned conductor (e.g., the first or second metalized layer) is formed of Ag or Cu.

In the aforementioned ceramic package 30 including the package main body 32 having an elongated circular shape in plan view and having the front surface 33 and the back surface 34, a plurality of second metalized layers each having a circular, elongated circular, or elliptical shape in plan view may be provided on the first metalized layer 41 at the two continuous corner portions C having a semicircular shape in plan view such that the second metalized layers are isolated from one another.

Each of the aforementioned ceramic packages 1 and 1a to 1d may also be in the form of a multi-piece ceramic package array in which a plurality of ceramic packages are adjacently arranged in a matrix form in plan view.

INDUSTRIAL APPLICABILITY

According to the present invention, there can be reliably provided a ceramic package having a cavity in which an electronic component such as a piezoelectric device is to be mounted, and which realizes even joining of a metallic frame around the opening thereof, as well as reliable sealing of the opening.

DESCRIPTION OF REFERENCE NUMERALS 1, 1a, 1e, 30: first ceramic package
1b, 1c: third ceramic package
1d: second ceramic package
2, 2a, 32: package main body
3, 33: front surface
4, 34: back surface
5, 35: outer side surface
6, 36: cavity
10: front surface of first metalized layer
11, 41: first metalized layer
12, 42: second metalized layer at side portion
12a to 12c, 42a: second metalized layer at corner portion
14: brazing material
15, 15a, 15b: outer side surface of brazing material
20: metallic frame
24: third metalized layer at corner portion
S: ceramic material
C: corner portion
w1, w2: width
θ1, θ2: inclination angle
d: diameter

What is claimed is:

1. A ceramic package comprising:
 a package main body which is formed of a ceramic material, which has a front surface and a back surface, and which has a cavity opening toward the front surface; and
 a first metalized layer which has a frame shape in plan view and is formed on the front surface; and a second metalized layer which is formed on the front surface of the first metalized layer so as to assume a frame shape, and which has a width smaller than that of the first metalized layer, the width being measured in an inward/outward direction of the package main body, the ceramic package being characterized in that:
 the width, in the inward/outward direction, of the second metalized layer at a corner portion of the front surface in plan view is smaller than the width, in the inward/outward direction, of the second metalized layer in a region other than the corner portion in plan view.

2. A ceramic package according to claim 1, wherein:
 the second metalized layer formed on the front surface of the first metalized layer is located, in the inward/outward direction of the package main body, nearer to one end of the front surface on the side toward the cavity than to the other end of the front surface on the side toward the outer side surface of the package main body; and
 the position of the second metalized layer at a corner portion in the inward/outward direction is nearer to the one end of the front surface on the side toward the cavity, as compared with the position, in the inward/outward direction, of the second metalized layer in a region of the front surface other than the corner portion.

3. A ceramic package according to claim 1, wherein:
 the package main body has, on the back surface thereof, an additional cavity similar to that on the front surface, and the additional cavity is symmetric with the cavity opening toward the front surface.

4. A ceramic package comprising:
 a package main body which is formed of a ceramic material, which has a front surface and a back surface, and which has a cavity opening toward the front surface;
 a first metalized layer which has a frame shape in plan view and is formed on the front surface; and a second metalized layer which is formed on the front surface of the first metalized layer so as to assume a frame shape, and which has a width smaller than that of the first metalized layer, the width being measured in an inward/outward direction of the package main body; and a metallic frame which is joined, via a brazing material, onto the first metalized layer and the second metalized layer, the ceramic package being characterized in that:

an inclination angle formed, at a corner portion of the front surface in plan view, between the front surface of the first metalized layer and the outer side surface of the brazing material which is located above the first metalized layer and outside the second metalized layer is smaller than an inclination angle formed, in a region of the front surface other than the corner portion in plan view, between the front surface of the first metalized layer and the outer side surface of the brazing material which is located above the first metalized layer and outside the second metalized layer.

5. A ceramic package according to claim 4, wherein:

the second metalized layer formed on the front surface of the first metalized layer is located, in the inward/outward direction of the package main body, nearer to one end of the front surface on the side toward the cavity than to the other end of the front surface on the side toward the outer side surface of the package main body; and the position of the second metalized layer at a corner portion in the inward/outward direction is nearer to the one end of the front surface on the side toward the cavity, as compared with the position, in the inward/outward direction, of the second metalized layer in a region of the front surface other than the corner portion.

6. A ceramic package according to claim 4, wherein:

the package main body has, on the back surface thereof, an additional cavity similar to that on the front surface, and the additional cavity is symmetric with the cavity opening toward the front surface.

* * * * *